(12) United States Patent
Gomes

(10) Patent No.: US 6,507,772 B1
(45) Date of Patent: Jan. 14, 2003

(54) SENSOR DEVICE

(75) Inventor: Dale Gomes, Berwick (AU)

(73) Assignees: Perdec Pty. Ltd., Kyneton (AU); Eden Worth Pty. Ltd., Berwick (AU)

( * ) Notice: Subject to any disclaimer, the term of this patent is extended or adjusted under 35 U.S.C. 154(b) by 0 days.

(21) Appl. No.: 09/582,818

(22) PCT Filed: Dec. 23, 1998

(86) PCT No.: PCT/AU98/01075

§ 371 (c)(1),
(2), (4) Date: Jul. 3, 2000

(87) PCT Pub. No.: WO99/35745

PCT Pub. Date: Jul. 15, 1999

(30) Foreign Application Priority Data

Jan. 2, 1998 (AU) .............................................. PP 1198
Jun. 17, 1998 (AU) .............................................. PP 4149

(51) Int. Cl.⁷ .............................................. G05B 15/00
(52) U.S. Cl. ......................... 700/258; 700/39; 700/110; 73/52
(58) Field of Search ................................ 700/257, 258, 700/259, 80, 81, 82, 39; 367/16, 76; 318/640; 73/649, 52

(56) References Cited

U.S. PATENT DOCUMENTS

| | | | | |
|---|---|---|---|---|
| 4,564,928 A | | 1/1986 | Glenn et al. ................. | 367/117 |
| 4,644,100 A | | 2/1987 | Brenner et al. .......... | 178/18.04 |
| 4,786,764 A | | 11/1988 | Padula et al. ............ | 178/19.04 |
| 4,870,559 A | * | 9/1989 | Hyatt ......................... | 318/640 |
| 5,850,458 A | * | 12/1998 | Tomisawa et al. ......... | 381/71.4 |
| 5,886,303 A | * | 3/1999 | Rodney ...................... | 181/102 |
| 5,940,065 A | * | 8/1999 | Babb et al. .............. | 178/18.01 |
| 6,229,760 B1 | * | 5/2001 | Ambs .......................... | 367/16 |

* cited by examiner

*Primary Examiner*—Leo Picard
*Assistant Examiner*—Kidest Bahta
(74) *Attorney, Agent, or Firm*—Burns, Doane, Swecker & Mathis, L.L.P.

(57) ABSTRACT

A sensor device comprising an interface medium having an outer layer for interaction by a user, at least two transducers located on or in the interface medium and spaced from the outer layer, and each adapted to generate a signal in response to interaction by the user, and a processor to receive the signal and determine the location on the outer layer at which the user has interacted with the outer layer.

11 Claims, 3 Drawing Sheets

SENSOR DEVICE

FIELD OF THE INVENTION

The invention relates to a sensor device which relies on transducers which are capable of being activated by, for example, sound, thermal conditions, light or chemicals.

BACKGROUND OF THE INVENTION

Whilst the following description is in terms of touch switch sensor technology, it will be appreciated that the invention is not limited to touch switch "sensors".

Conventional touch sensitive technology is limited to highly electrically insulated areas of sensitivity (ie in terms of electrical resistance or capacitance) between adjacent touch sensitive areas. These insulated areas are required to prevent touch sensitive areas from being activated from an area adjacent to that area being touched.

Unfortunately such insulative requirements usually mean that complicated manufacturing techniques need to be adopted, both in terms of design and process steps. For example, in conventional user interfaces (touch pads) used in automatic teller machines, the touch pad is fabricated by providing a number of layers of plastic in predetermined areas. This arrangement of layers ensures that adjacent touch sensitive areas are not inadvertently activated.

Likewise physical barriers have been introduced to prevent such undesired activation. These are usually in the form of a rigid metal or rigid plastic stencil which overlays the touch sensitive areas and has openings which align with each individual touch sensitive area. Therefore, the stencil provides a rigid barrier between these areas. Another alternative which has been used is to provide a semi-rigid form of stencil under the outer touch pad.

As each of these approaches is complicated, a higher number of components may be required for the touch plate interface, thereby involving extra manufacturing processes and hence a higher manufacturing cost becomes apparent.

DESCRIPTION OF THE INVENTION

According to one embodiment of the invention, a sensor device is provided which comprises:

(a) an interface medium having an outer layer for interaction by a user;

(b) at least two transducers located on or in, the interface medium and spaced from the outer layer, and each adapted to generate a signal in response to interaction by the user; and (c) a processor to receive the signal and determine the location on the outer layer at which the user has interacted with the outer layer.

Typically, the transducers are sound, thermal, light and/or chemically activated. Typically, the location of the interaction determined by the processing means is achieved by differential sensing of the transducers. One way of doing this is by digital (including computational software), analogue or both, signal conditioning which provides an absolute "sensed" position on or in that outer layer.

Such type of sensor device permits the transducers to be used in an array (depending on the thickness of the interface medium) or a multi dimensional array, thereby providing discrete "spatial" sensitive areas as well as conventional two dimension applications.

One example of the two dimensional application is as a key pad. The sensing device is able to discriminate between adjacent transducers through a structurally rigid monolithic plate (in the key pad example). When the transducer(s) are activated, this state maybe determined through electrical signal conditioning circuits, such as an amplifier and/or appropriate computer software (eg digital sequence programming). In another example, the sensing device may be used on urinal wall plates to activate flushing systems.

Preferably, the processor is a microcomputer.

In yet another preferred embodiment of the invention, the sensor device may include a "touch hold function". This function is used when continual interaction by the user with the sensor device is needed over a predetermined time to achieve a desired effect. For example, if the sensor device is to be used to allow dimming of lights or adjustment of volume etc.

This touch hold function may be implemented by the "unique characteristic" that a user, whilst interacting with the interface medium, will always generate a signal of predictable (and therefore) filterable amplitude(s) over a determined time duration, no matter how still the user may think they are interacting with the interface medium.

For example, the software filter could set the initial detection threshold at the interface medium quite high, until the user interaction is detected (eg. user touches the interface medium), and then after a certain validation period, the detection threshold is lowered into the domain where continued interaction (ie without the user removing his interaction with the interface medium) by the user, can still be detected until such time when the user terminates such interaction with the interface.

Examples of "Transducers"

Pressure wave activated transducers such as microphone or piezo electric transducers maybe utilised. Piezo electric based transducers have "electro mechanical" and "mechanical electrical" characteristics, meaning that they may produce a physical displacement of a mechanically coupled resonator plate by way of the application of pulse/s of voltage across its connection plates or the generation of a voltage pulse when a dynamic physical application of mechanical force is applied to one of the connection plates relatively to the other plate.

The pressure wave activated transducers may be either in the form of "discrete devices" or alternatively, the pressure wave activated transducers may be fabricated directly onto or into either the interface medium.

Another example of a transducer is any PVDF (Polyvinylidene fluoride) type material, which displays characterisitcs which are both piezoelectric and pyroelectric sensitive. (Either or both characteristics are applicable to this invention)

Accordingly, the sensor device of the invention may be a sensor array for a monolithic interface plate provided with discretely sensitive (but invisible) areas. The simple (visual and mechanically) interface lends itself to use in "unfriendly" environments where conventional complex "touch switch" technologies cannot be easily implemented, such as oil saturated environments e.g. an NC machine workshop.

In the case of an application of the sensor device requiring more than one sensitive area on the interface plate, high discrimination between adjacent sensors as well as ambient noise can be achieved by either the utilisation of active and or passive differential sensing techniques.

DESCRIPTION OF DRAWINGS AND THE PRACTICAL EMBODIMENTS

Figure 1:
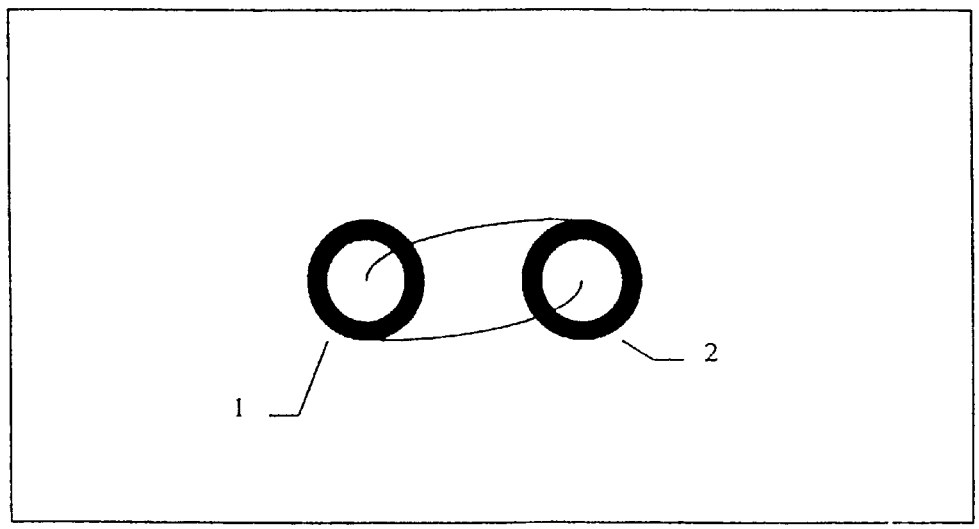
FIG. 1 is a conceptual view of a passive differential sensing device.

The invention is now further illustrated with reference to the following drawings and practical embodiments:

Embodiment A—Passive Differential Sensing—FIG. 1

The simplest form of differential sensing may be a passive technique where a separate ambient noise transducer 1 is connected in anti phase to the main transducer 2, thereby cancelling out common noise picked up by both of the transducer at the same moment in time. The back of the main transducer 2 is attached to the front of the noise transducer 1 and vice versa.

In this way, when a net positive signal is generated, this will mean that the sensing device has been activated.

Figure 2:
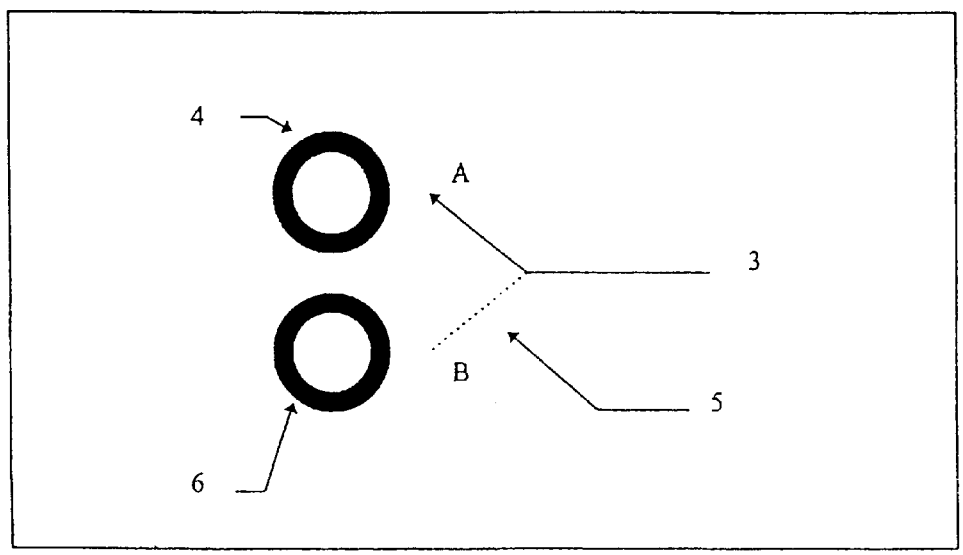
FIG. 2 is a conceptual view of a sensing device which uses a multiplexed sampling technique.

Embodiment B—Multiplexed Sampling Techniques—FIG. 2

In more complex and tighter sensing arrangements, multiplexed sampling techniques and/or the addition of extra sensors for the measurement of ambient sonic activity may be adopted. The discrimination is ultimately determined through further electronic circuits and/or software analysis 3.

In the depicted embodiment, the transducer which is to be actually sensed (at this point in time) is transducer 4. Therefore the electronic switch 5 is changed to position "B" at which point the "noise" level is detected and stored temporarily in memory. The electronic switch is now changed to position "A" and another reading is taken from the transducer 4. When comparison of the two readings is undertaken and a result is found that the second reading is significantly higher, then it is apparent that transducer 4 has been activated. Obviously, the same technique may be followed when transducer 6 is the transducer which is to be actually sensed at another point in time. This is an example of multiplexed sampling technique. However, there are many other ways this technique can be implemented.

Figure 3:
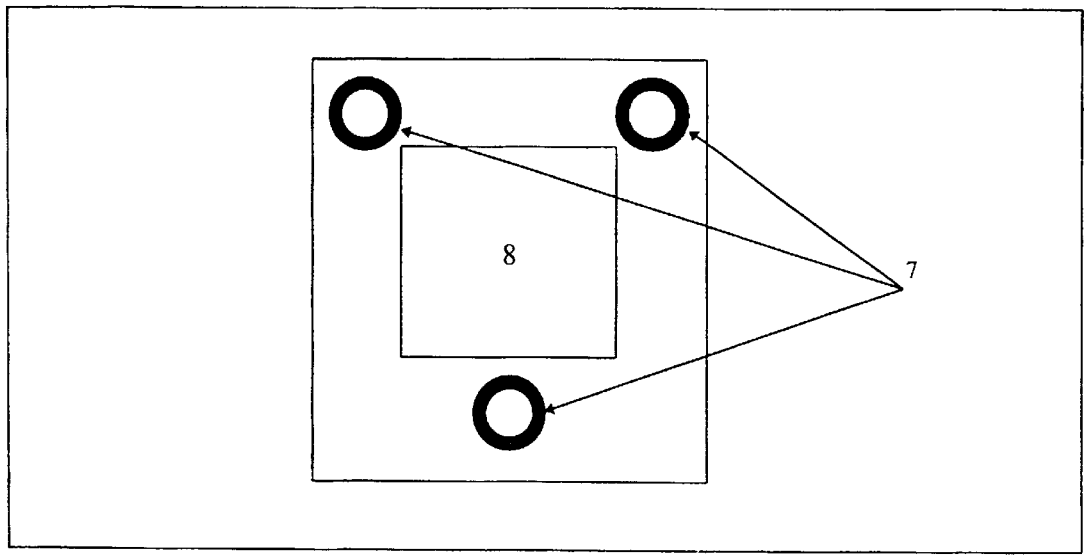
FIG. 3 is a conceptual view of a sensing device which uses a linear control type technique.
Figure 4:
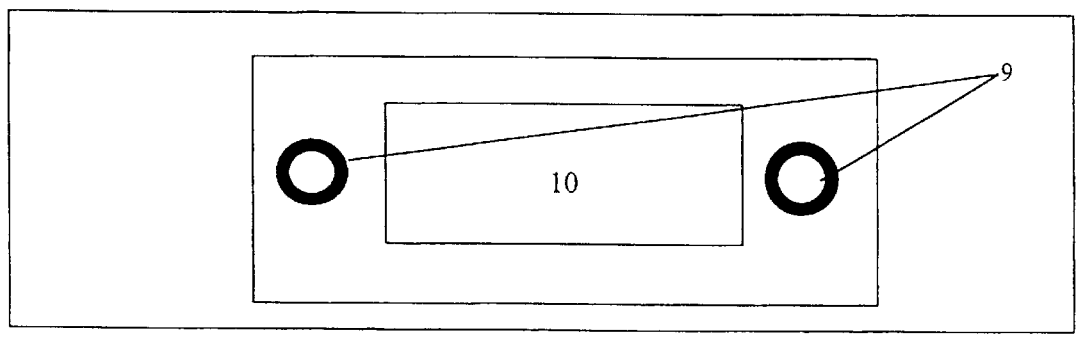
FIG. 4 is a conceptual view of a sensing device which uses an alternate linear control type technique.
Figure 5:
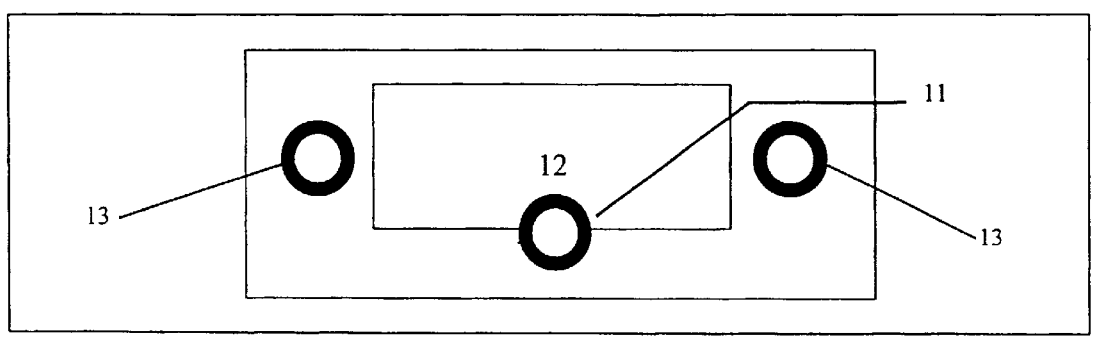
FIG. 5 is a conceptual view of a sensing device which uses a further alternate linear control type technique.

Embodiment C—Linear Control Type Applications—FIGS. 3, 4 & 5

For "linear" control type applications (eg a touch sensitive variable control and for complex arrays of sensitive areas), sensors may be arranged in triangulated or other patterns. In this way absolute position information is provided by use of signal level or frequency (via Doppler shift measurements) differentiation between the transducers to determine the position being sensed. In some circumstances, the interface plate between the user and the transducer may need a predetermined pattern embedded or etched into its' surface to aid detection of the sensed point depending on the type of transducers utilised.

In the arrangement depicted in FIG. 3, although only three transducers 7 are utilised, a number of "virtual" transducers can be implemented by measuring the differences in the outputs of the transducers 7 and thus determining the position of a point being touched on the sensing area 8. The number of such "virtual" transducers is limited by the resolution of the differentiation hardware and software as well as ambient noise.

In the arrangement depicted in FIG. 4 only two transducers 9 are utilised, a number of "virtual" transducers can be implemented by measuring the differences in the outputs of the transducers and thus determining the position of a point being touch on the sensing area 10.

In both these arrangements, the sensing areas can be used to detect the linear position of a point being stimulated on the plate, using the differential sensing technique.

In addition to the previous linear/array sensing techniques, another variation is depicted in FIG. 5. It requires a local resonating device or excitor 11 attached to the interface plate. The excitor 11 sets up an excitation stimuli through the sensing area 12. The output of both transducers 13 are then measured and stored in electronic memory when no external activation of the interface plate by an external force (eg touch) is present. Readings from the transducers are then continually measured and compared with the prior readings to determine if any interaction with the plate has been made by an external event and appropriate action is then undertaken as required by analogue, digital, computational or a combination of such, analysis.

Embodiment D—Tactile Feedback

Tactile feedback may be an important requirement by users of sensing devices of the invention. This may be implemented via the sensing transducers. However, this is only applicable if one transducer is utilised for each sensed position on the interface plate. In this arrangement, feedback is given to the user by providing a drive signal to the transducer upon activation of the transducer which gives some form of notification to the user.

Alternatively, conventional type "dome" and malleable membrane's (eg made of rubber, silicone etc) can be positioned over the surface of the interface plate to provide tactile feedback, yet maintaining a fully sealed and electrically isolated unit.

Accordingly, the sensor device according to the invention may be used in any environment where it is desirable to have differential monitoring of interaction on or in the interface medium.

Some examples of applications are as follows:

Highly secure keypad interface

"Vandal proof" Automatic detection systems

Fault and/or dynamic, early warning "fatigue" failure detection systems of critical structures eg. aircraft fuselages, large civil engineering structures etc.

Monitoring of the dynamics of fluids

As the sensor device enables the use of simple continuous interface mediums (i.e. without the need to implement physically or electrically isolated sense areas), both simplified manufacturing techniques as well as the ease of customisation of such interfaces with minimal impact or no impact on the final performance of the interface, is achieved.

The word 'comprising' and forms of the word 'comprising' as used in this description and in the claims does not limit the invention claimed to exclude any variants or additions which are obvious to the person skilled in the art and which do not have a material effect upon the invention.

Other modifications of and improvements to the invention will be readily apparent to those skilled in the art of designing and manufacturing sensor devices. Such modifications and improvements are considered to be within the scope of the invention.

The claims defining the invention are as follows:

1. A sensor device comprising:

(a) an interface medium having an outer layer;

(b) at least two acoustic transducers located on or in the interface medium and spaced from the outer layer, wherein each of said transducers is adapted to generate a signal in response to noise propagating through the interface medium as a result of a user interacting with the outer layer of said interface medium; and (c) a processor to receive and analyze the signals generated by the at least two acoustic transducers and to determine a location on the outer layer corresponding to the user interaction, wherein the physical characteristics of the interface medium remain substantially unchanged as a result of the user interaction.

2. The sensor device of claim 1 wherein the transducers are arranged in an array.

3. The sensor device of claim 2 wherein the transducers are arranged in a two dimensional array.

4. The sensor device of claim 2 wherein the transducers are arranged in a three dimensional array.

5. The sensor device of claim 1 wherein the processor includes an amplifier and appropriate computer software.

6. The sensor device of claim 1 wherein the processor is a microcomputer.

7. The sensor device of claim 5, wherein said appropriate computer software comprises digital sequence programming.

8. The sensor device of claim 1 wherein said at least two acoustic transducers are passive devices.

9. A method for determining the location of a user interaction with a rigid outer layer of a sensing device, where the sensing device includes first and second acoustic transducers and a processor, said method comprising the steps of:

generating a first signal, by way of said first acoustic transducer, in response to noise propagating through the interface medium as a result of the user interacting with the outer layer of the interface medium;

generating a second signal, by way of said second acoustic transducer, in response to the noise propagating through the interface medium;

differentially analyzing said first and said second signals; and determining, based on the result of the differential analysis, the location on the outer layer which corresponds to the user interaction.

10. The method of claim 9 wherein said step of differentially analyzing said first and said second signals comprises the step of:

comparing the amplitude of the first signal and the second signal.

11. The method of claim 9 wherein said step of differentially analyzing said first and said second signals comprises the step of:

determining a time delay between the first signal and the second signal.

* * * * *